US010191126B2

(12) United States Patent
He et al.

(10) Patent No.: US 10,191,126 B2
(45) Date of Patent: Jan. 29, 2019

(54) SYSTEMS AND METHODS FOR SPATIAL GRADIENT-BASED ELECTRICAL PROPERTY PROPERTIES TOMOGRAPHY USING MAGNETIC RESONANCE IMAGING

(71) Applicants: Bin He, Arden Hills, MN (US); Jiaen Liu, Minneapolis, MN (US); Xiaotong Zhang, St. Paul, MN (US); Pierre-Francois Van de Moortele, Minneapolis, MN (US)

(72) Inventors: Bin He, Arden Hills, MN (US); Jiaen Liu, Minneapolis, MN (US); Xiaotong Zhang, St. Paul, MN (US); Pierre-Francois Van de Moortele, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 656 days.

(21) Appl. No.: 14/245,145

(22) Filed: Apr. 4, 2014

(65) Prior Publication Data

US 2014/0300354 A1 Oct. 9, 2014

Related U.S. Application Data

(60) Provisional application No. 61/808,505, filed on Apr. 4, 2013.

(51) Int. Cl.
G01V 3/00 (2006.01)
G01R 33/24 (2006.01)
G01R 33/44 (2006.01)

(52) U.S. Cl.
CPC ......... G01R 33/246 (2013.01); G01R 33/443 (2013.01)

(58) Field of Classification Search
USPC ........................................................ 324/309
See application file for complete search history.

(56) References Cited

U.S. PATENT DOCUMENTS

2006/0106299 A1* 5/2006 Uchizono .......... G01R 33/3415
600/410
2008/0129298 A1* 6/2008 Vaughan .............. G01R 33/583
324/322
2011/0044524 A1* 2/2011 Wang ..................... G01R 33/54
382/131

(Continued)

OTHER PUBLICATIONS

Adriany, et al., A Geometrically Adjustable 16-Channel Transmit/Receive Transmission Line Array for Improved RF Efficiency and Parallel Imaging Performance at 7 Tesla, Magnetic Resonance in Medicine, 2008, 59:590-597.

(Continued)

Primary Examiner — Rodney E Fuller
(74) Attorney, Agent, or Firm — Quarles & Brady LLP

(57) ABSTRACT

Systems and methods for producing an image of the electrical properties of an object using magnetic resonance imaging ("MRI") are provided. The electrical properties are determined based on estimated gradient values of the electrical properties of the object. For instance, electrical property maps are reconstructed using a spatial integration on gradient values that are estimated from the magnitude and relative phase values derived from measurements of multiple transmit and receive $B_1$ fields. Specific absorption rate ("SAR") maps can also be produced based on the estimated electrical properties.

21 Claims, 4 Drawing Sheets

(56) References Cited

U.S. PATENT DOCUMENTS

2011/0052029 A1* 3/2011 Connah .................. G06T 5/50
                                                    382/131
2012/0286783 A1* 11/2012 Constable .......... G01R 33/5611
                                                    324/309
2013/0265046 A1* 10/2013 Koch ............... G01R 33/56536
                                                    324/309
2015/0130459 A1* 5/2015 Driehuys ............. G01R 33/483
                                                    324/309

OTHER PUBLICATIONS

Haacke, et al., Extraction of Conductivity and Permittivity Using Magnetic Resonance Imaging, Physics in Medicine and Biology, 1991, 36(6):723-734.

Halter, et al., Electrical Impedance Spectroscopy of Benign and Malignant Prostatic Tissues, The Journal of Urology, 2008, 179(4):1580-1586.

Hoult, The Principle of Reciprocity in Signal Strength Calculations—A Mathematical Guide, Concepts in Magnetic Resonance, 2000, 12(4):173-187.

Hu, et al., Magnetoacoustic Imaging of Human Liver Tumor with Magnetic Induction, Applied Physics Letters, 2011, 98:023703-1 thru 023703-3.

Huhndorf, et al., Systematic Brain Tumor Conductivity Study with Optimized EPT Sequence and Reconstruction Algorithm, Proc. Intl. Soc. Mag. Reson. Med., 2013, 21:3626.

Katscher, et al., Determination of Electric Conductivity and Local SAR Via B1 Mapping, IEEE Transactions on Medical Imaging, 2009, 28(9)1365-1374.

Katscher, et al., B1-Based Specific Energy Absorption Rate Determination for Nonquadrature Radiofrequency Excitation, Magnetic Resonance in Medicine, 2012, 68(6):1911-1918.

Li, et al., Multi-Excitation Magnetoacoustic Tomography with Magnetic Induction for Bioimpedance Imaging, IEEE Trans. Med. Imaging, 2010, 29(10)1759-1767.

Liu et al., Imaging Electrical Properties of Human Head with Tumor Using Multi-Channel Transceiver Coil at UHF: A Simulation Study, Proc. Intl. Soc. Mag. Reson. Med., 2012, 20:3486.

Mariappan, et al., Magnetoacoustic Tomography with Magnetic Induction: Bioimpedance Reconstruction Through Vector Source Imaging, IEEE Trans. Med. Imaging, 2013, 32(3), 20 pages.

Metherall, et al., Three Dimensional Electrical Impedance Tomography, Nature, 1996, 380(6574):509-512.

Oh, et al., Conductivity and Current Density Image Reconstruction Using Harmonic Bz Algorithm in Magnetic Resonance Electrical Impedance Tomography, Physics in Medicine and Biology, 2003, 48:3101-3116.

Paulson, et al., Optimal Experiments in Electrical Impedance Tomography, IEEE Transactions on Medical Imaging, 2002, 12(4):681-686.

Seo, et al., Error Analysis of Nonconstant Admittivity for MR-Based Electric Property Imaging, IEEE Transactions on Medical Imaging, 2012, 31(2):430-437.

Shin, et al., Quantification Error in MREPT Due to B1 Map Inaccuracy, Proc. Intl. Soc. Mag. Reson. Med., 2012, 20:2533.

Solazzo, et al., Radiofrequency Ablation: Importance of Background Tissue Electrical Conductivity—An Agar Phantom and Computer Modeling Study, Radiology, 2005, 236:495-502.

Van Lier, et al., B1+ Phase Mapping at 7T and Its Application for In Vivo Electrical Conductivity Mapping, Magnetic Resonance in Medicine, 2012, 67(2):552-561.

Voigt, et al., Quantitative Conductivity and Permittivity Imaging of the Human Brain Using Electric Properties Tomography, Magnetic Resonance in Medicine, 2011, 66(2):456-466.

Wen, Noninvasive Quantitative Mapping of Conductivity and Dielectric Distributions Using RF Wave Propagation Effects in High-Field MRI, Proc. SPIE 5030, Medical Imaging 2003: Physics of Medical Imaging, 471-477.

Woo, et al., Magnetic Resonance Electrical Impedance Tomography (MREIT) for High-Resolution Conductivity Imaging, Physiological Measurement, 2008, 29:R1-R26.

Xu, et al., Magnetoacoustic Tomography with Magnetic Induction (MAT-MI), Phys. Med. Biol., 2005, 50(21):5175-5187.

Yarnykh, Actual Flip-Angle Imaging in the Pulsed Steady State: A Method for Rapid Three-Dimensional Mapping of the Transmitted Radiofrequency Field, Magnetic Resonance in Medicine, 2007, 57(1):192-200.

Zhang, et al., Whole Body Traveling Wave Magnetic Resonance Imaging at High Field Strength: Homogeneity, Efficiency, and Energy Deposition as Compared With Traditional Excitation Mechanisms, Magnetic Resonance in Medicine, 2012, 67(4):1183-1193.

Zhang et al., Imaging Electric Properties of Biological Tissues by RF Field Mapping in MRI, IEEE Trans. Med. Imaging, 2010, 29(2):474-481.

* cited by examiner

SYSTEMS AND METHODS FOR SPATIAL GRADIENT-BASED ELECTRICAL PROPERTY PROPERTIES TOMOGRAPHY USING MAGNETIC RESONANCE IMAGING

CROSS-REFERENCE TO RELATED APPLICATIONS

This application claims the benefit of U.S. Provisional Patent Application Ser. No. 61/808,505, filed on Apr. 4, 2013, and entitled "METHODS AND APPARATUS FOR MAGNETIC RESONANCE ELECTRICAL PROPERTIES TOMOGRAPHY."

STATEMENT REGARDING FEDERALLY SPONSORED RESEARCH

This invention was made with government support under EB007920 and EB006433 awarded by National Institutes of Health. The government has certain rights in the invention.

BACKGROUND OF THE INVENTION

The field of the invention is systems and methods for electrical properties tomography ("EPT"). More particularly, the invention relates to systems and methods for EPT using magnetic resonance imaging ("MRI").

Electrical properties of biological tissues, which include of electrical conductivity and permittivity, depend on the frequency of external electromagnetic fields. The electrical properties also vary as a function of the relative intracellular and extracellular fluid volumes, the ionic concentrations, and the cellular membrane permeability. Both electrical conductivity and permittivity can be affected by various pathological conditions. For instance, ex vivo experimental results have shown that cancerous tissues have significantly different electrical property values—over a wide electromagnetic frequency spectrum—compared to normal tissues. Examples include differences of more than 200 percent for breast cancer and more than 100 percent for bladder cancer at radio frequencies and microwave frequencies. It is therefore anticipated that electrical property imaging is able to provide important information for cancer diagnosis and monitoring disease progression.

In the past decades, a number of efforts have been made in an attempt to map electrical property distributions in vivo. Recently, electrical properties tomography ("EPT") has gained considerable interest as a non-invasive, in vivo imaging approach to simultaneously map conductivity and permittivity at the Larmor frequency of protons using MRI scanners. Compared with the related technique, electrical impedance tomography ("EIT"), EPT provides significantly higher spatial resolution, does not require electrode mounting or current injection, and is not hampered by shielding effects due to non-conductive media. Although magnetic resonance electrical impedance tomography ("MREIT") has been developed to address the low spatial resolution of EIT, it still needs considerable amount of current to be injected into the object, which can be harmful for in vivo applications, and also suffers from the shielding effects noted above.

In addition to their value for assessing tissue pathology, electrical property values at the operating Larmor frequency are a key factor in quantifying local specific absorption rate ("SAR"). At high (3T) and ultra-high (≥7T) field magnetic field strengths, SAR poses a safety concern in MRI examinations and becomes a significant limiting factor in MRI applications. Knowing electrical property distributions could help deduce the applied radio frequency ("RF") electric fields and allow for fast, subject-specific SAR estimation. Using this SAR information as a constraint to design RF pulses could enhance flexible management of tissue heating and could optimize the RF excitation efficacy, which in turn would contribute to further optimizing the use of high-field and ultra-high-field MRI scanners. The practical use of these high-field and ultra-high-filed MRI scanners would make the intrinsically higher signal-to-noise ratio ("SNR") and contrast-to-noise ratios ("CNR") obtained with these systems available to routine clinical use.

The concept of imaging electrical properties based on measured magnetic resonance signals was introduced by E. M. Haacke, et al., in "Extraction of conductivity and permittivity using magnetic resonance imaging," *Phys. Med. Biol.*, 1991; 36:723-734. In that work, the authors suggested that as the field strength increases, the RF wavelength reduces to be on the order of the body size, distortions of the $B_1$ fields occur inside the sample, from which the electrical properties could be estimated. H. Wen later pointed out in "Noninvasive quantitative mapping of conductivity and dielectric distributions using RF wave propagation effects in high-field MRI," *Proc. SPIE* 5030, Medical Imaging 2003: Physics of Medical Imaging, 471-477, that the perturbation of the RF field in high-field MRI directly relates with the conductivity and permittivity distribution in the sample, and could be explained by an electromagnetic wave equation—the homogeneous Helmholtz equation. From then on, this equation has been utilized in the majority of EPT studies.

Biological tissues may exhibit rapid spatial changes in electrical properties due to their complicated structures. Such rapid spatial variation in electrical properties has been a challenge to existing EPT approaches as most of them are based upon the homogenous formula. Derived from Maxwell's equations, several algorithms trying to tackle the boundary issue have been proposed, either based on the inhomogeneous Helmholtz equations or utilizing the continuous nature of Gauss's Law for magnetism. However, in vivo applications reported so far making use of these algorithms often result in EP maps suffering inconstant fidelity and fairly large variance, due to either high computational demands of the numerical solution or the inherently high sensitivity of such EPT algorithms to measurement noise.

In light of the foregoing, there remains a need to provide a reliable method for performing EPT in the presence of noise and for inhomogeneous media, especially at boundaries between biological tissues having different electrical property characteristics.

SUMMARY OF THE INVENTION

The present invention overcomes the aforementioned drawbacks by providing a method for measuring electrical properties of tissue from their estimated spatial gradient using a magnetic resonance imaging ("MRI") system. The method includes directing the MRI system to acquire $B_1^+$ map data for each channel in a multichannel transmitter while a subject is present in the MRI system, and directing the MRI system to acquire a $B_1^-$ map data for each channel in a multichannel receiver while the subject is present in the MRI system. From the acquired $B_1^+$ map data, a $B_1^+$ field magnitude map and a $B_1^+$ relative phase map are derived for each channel in the multichannel transmitter. Likewise, from the acquired $B_1^-$ map data, a $B_1^-$ field magnitude map and a $B_1^-$ relative phase map are derived for each channel in the multichannel receiver. Spatial gradient values of electrical properties of the tissue are then computed from the derived $B_1^+$ field magnitude maps, $B_1^+$ relative phase maps, $B_1^-$ field magnitude maps, and $B_1^-$ relative phase maps. The electrical properties of the subject are then computed by spatially integrating the estimated spatial gradient values. A report that depicts the estimated electrical property values can then be produced.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
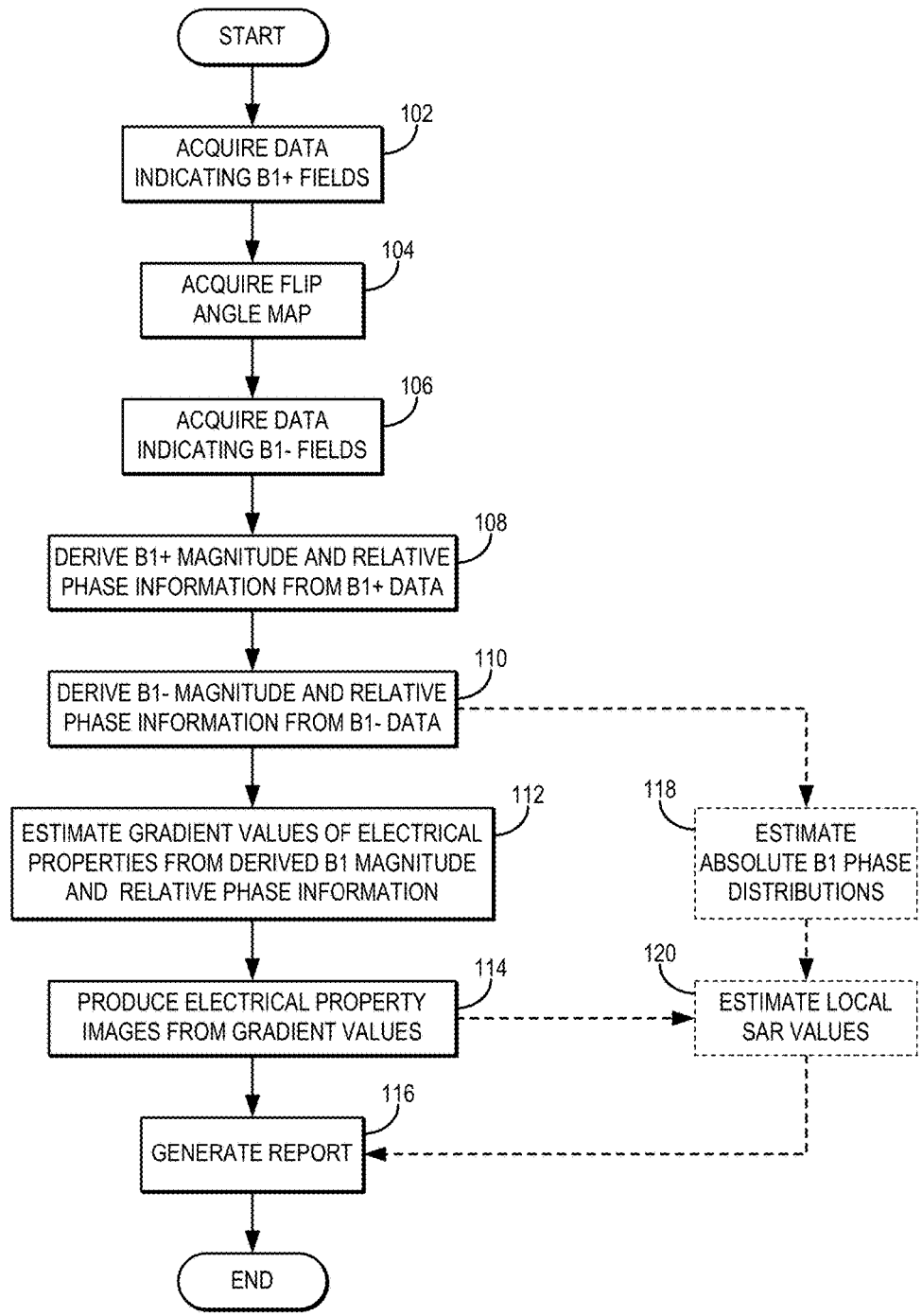
FIG. 1 is a flowchart setting forth the steps of an example method for producing images of electrical properties from measurements of $B_1$ transmit and receive fields acquired using magnetic resonance imaging ("MRI")

Described here are systems and methods for producing an image of the electrical properties of an object using magnetic resonance imaging ("MRI"). As an example, the imaged electrical properties may include electrical conductivity and electrical permittivity in the object, which may be a human subject or a particular region-of-interest therein, such as the subject's brain. The electrical properties are determined based on estimated gradient values of the electrical properties of the object. For instance, electrical property maps are reconstructed using a spatial integration on gradient values that are estimated from the magnitude and relative phase value derived from measurements of multiple transmit and receive $B_1$ fields. Furthermore, based on measurements of transmit and receive $B_1$ fields, local SAR maps can be estimated. Because the systems and methods of the present invention produce electrical property maps using such a gradient-based analysis, the systems and methods may be referred to as gradient-based electrical properties tomography ("gEPT").

In general, the gEPT technique includes using a radio frequency ("RF") multichannel transmit/receiver coil array for RF power transmission and magnetic resonance signal reception. As mentioned above, the spatial gradient of the electrical properties is derived using the magnitude and relative phase values of multiple transmit and receive $B_1$ field maps measured on the multiple channels of the RF coil. The final electrical property maps are then reconstructed via spatial integration on the obtained gradient field.

The gEPT technique described here excels at dealing with biological tissues with complex anatomical structures. Previous MRI-based EPT inverse algorithms employed the Helmholtz equation as the central reconstruction equation, by assuming piecewise homogeneous electrical property distributions for each specified tissue and by considering the spatial variation of the electrical properties to be negligible along tissue boundaries. Thus, these previous methods suffer from coarse voxel resolution (e.g., on the order of 3-5 mm), resulting in difficulties when these methods are applied to actual biological tissues with complex anatomical structures, such as the human head.

The systems and methods of the present invention, however, overcomes these limitations by employing Gauss's Law for magnetism and utilizing the continuously differentiable nature of the magnetic field vector in space. In addition, the spatial variation of electrical property distribution is taken into account in the central inverse equation, removing the piecewise homogeneous assumption, and leading to a higher spatial resolution (e.g., on the order of 1.5 mm and finer). Therefore, more accurate electrical property maps can be reconstructed using the systems and methods of the present invention.

The systems and methods of the present invention are also robust against systematic noise, which could otherwise severely contaminate the $B_1$ measurements. This decrease in noise contamination results in the ability to acquire the necessary data using a shorter acquisition time (i.e., by less repetition time), thereby rendering the technique more readily adaptable to the clinical setting.

The systems and methods of the present invention are also readily adaptable to ultra-high-field MRI applications. The advantages of high-field MRI include improved signal-to-noise ratio ("SNR") and increased sensitivity for contrast mechanisms, which can translate to reduced voxel size that produces finer spatial sampling of the magnetic resonance signal.

Inside an MRI scanner, the RF field is usually operated to be centered closely to the Larmor frequency of a particular nuclei of interest and, therefore, the RF field can be treated as a time-harmonic field. Combining the time-harmonic Ampere's Law and Faraday's Law in Maxwell's equations, the following equation underlying EPT theory can be derived:

$$-\nabla^2 B(r) = \omega^2 \varepsilon_c(r) \mu_0 B(r) + \nabla \varepsilon_c(r) \times \left[ \frac{\nabla \times B(r)}{\varepsilon_c(r)} \right]; \quad (1)$$

where B is the magnetic field vector in a Cartesian coordinate system, r denotes position, $\omega$ is the Larmor angular frequency for protons, $\varepsilon_c(r) = \varepsilon(r) - i\sigma(r)/\omega$ is the complex permittivity, $\sigma$ is the conductivity, $\varepsilon$ is the permittivity, and $\mu_0$ is the magnetic permeability of free space. Here, $\varepsilon$ is measured in units of $\varepsilon_0$, which is the permittivity of free space. For the sake of simplicity, the spatial coordinate variable, r, is dropped from the equations and description below.

Equation (1) can be transformed to be expressed in terms of the transmit ($B_1^+$) and receive ($B_1^-$) $B_1$ fields, which are the $B_1$ field components in the positively and negatively rotating coordinates, respectively. By combining the Cartesian RF field components ($B_x$ and $B_y$) in the transverse xy-plane into the forms of $B_1^+$ and $B_1^-$ in the rotating frames, the time-harmonic dual-excitation equation of Eqn. (1) can be transformed to the following:

$$-\nabla^2 B_1^+ = \omega^2 \varepsilon_c \mu_0 B_1^+ + (ig_x - g_y)\left(i\frac{\partial B_1^+}{\partial x} + \frac{\partial B_1^+}{\partial y} + i\frac{1}{2}\frac{\partial B_z}{\partial z}\right) + \quad (2)$$
$$g_z\left(-\frac{\partial B_1^+}{\partial z} + \frac{1}{2}\frac{\partial B_z}{\partial x} + i\frac{1}{2}\frac{\partial B_z}{\partial y}\right);$$

where g denotes $\nabla \ln \varepsilon_c$, which is the gradient field of the natural logarithm of $\varepsilon_c$. As can be seen in Eqn. (2), the transverse components of g are linearly combined. Therefore, in order to solve all three components of g, another equation with different coefficients for $g_x$ and $g_y$ is obtained by combining $B_x$ and $B_y$ into $B_1^-$:

$$-\nabla^2 B_1^- = \omega^2 \varepsilon_c \mu_0 B_1^- + (ig_x + g_y)\left(i\frac{\partial B_1^-}{\partial x} - \frac{\partial B_1^-}{\partial y} + i\frac{1}{2}\frac{\partial B_z}{\partial z}\right) + \quad (3)$$
$$g_z\left(-\frac{\partial B_1^-}{\partial z} + \frac{1}{2}\frac{\partial B_z}{\partial x} - i\frac{1}{2}\frac{\partial B_z}{\partial y}\right).$$

In Eqns. (2) and (3), $$B_1^\pm = |B_1^\pm| e^{i(\Delta\phi^\pm + \phi_0^\pm)} \quad (4);$$

is the complex transmit or receive $B_1$ field of a specific channel with its relative phase $\Delta\phi^\pm$ compared to a reference channel with absolute phase $\phi_0^\pm$.

It is contemplated that the elimination of the $B_z$ terms in Eqns. (2) and (3) will not be a significant source of error, especially when using an RF coil array that has a uniform geometry along the z-direction. This assumption has been adopted in previous EPT studies and is supported by simulation results using EM modeling, such as in the study described by B. Zhang, et al., in "Whole body traveling wave magnetic resonance imaging at high field strength: homogeneity, efficiency, and energy deposition as compared with traditional excitation mechanisms," *Magn. Reson. Med.*, 2012; 67:1183-1193

Thus, by removing the $B_z$-related terms, Eqns. (2) and (3) can be rewritten in the following vector-matrix form:

$$\nabla^2 B_1^+ = -\omega^2 \mu_0 B_1^+ \varepsilon_c + (\nabla B_1^+)^T \begin{bmatrix} 1 & i & 0 \\ -i & 1 & 0 \\ 0 & 0 & 1 \end{bmatrix} g; \quad (5)$$

$$\nabla^2 B_1^- = -\omega^2 \mu_0 B_1^- \varepsilon_c + (\nabla B_1^-)^T \begin{bmatrix} 1 & -i & 0 \\ i & 1 & 0 \\ 0 & 0 & 1 \end{bmatrix} g. \quad (6)$$

As will be described in detail below, by employing $|B_1^\pm|$ and $\Delta\phi^\pm$ of multiple independent channels measured through $B_1$ mapping, the unknowns of $g = \nabla \ln \varepsilon_c$ and $\nabla\phi_0$ can be calculated based on Eqns. (5) and (6). Utilizing known a priori values or estimates for $\sigma$ and $\varepsilon$ at certain locations, electrical properties can be reconstructed from $\varepsilon_c$ extracted from the gradient values, g, using a spatial integration, which may include using a finite difference method. The a priori information can be obtained utilizing the measured electrical properties at certain points where the conventional EPT techniques should work effectively, such as within a region with homogeneous distribution of electrical properties.

The complex $B_1^\pm$ values can be decomposed into their magnitude and phase components. Taking the magnitude and relative phase of $B_1^+$ or $B_1^-$ as known information, for any individual voxel in the image domain, each of the identities in Eqns. (5) and (6) will separately lead to a second-order polynomial equation of the following unknowns: $\nabla^2\phi_0^+$, $\nabla\phi_0^+$, $\nabla^2\phi_0^-$, $\nabla\phi_0^-$, $\sigma$, $\varepsilon$, $g_x$, $g_y$, and $g_z$. Here, $\phi_0^+$ or $\phi_0^-$ refer to the absolute phase of a specific $B_1^+$ or $B_1^-$. The following terms are unknowns in Eqn. (5): $\nabla^2\phi_0^+ + \sigma$; $\nabla\phi_0^+$; $\varepsilon$; the real and imaginary parts of $ig_x - g_y$; and $g_z$. Similarly, the following terms are unknowns in Eqn. (6): $\nabla^2\phi_0^- + \sigma$; $\nabla\phi_0^-$; $\varepsilon$; the real and imaginary parts of $-ig_x - g_y$; and $g_z$.

Using a transceiver RF coil array with a number of channels, $N_{ch}$, Eqns. (5) and (6) can be separated into real and imaginary groups to obtain $2 \times N_{ch}$ equations for either $B_1^+$ or $B_1^-$, from which the unknowns can be derived. In some embodiments, the unknown gradient values, g, can be derived by solving the equation sets using a linear inverse solution by grouping the high-order nonlinear unknown terms into independent linear ones. In some other embodiments, the unknown gradient values, g, can be derived by employing nonlinear optimization methods to minimize the overall residual errors of all the equations.

As mentioned above, electrical property maps can be reconstructed from the gradient values, g, using a spatial integration method over the gradient values. It will be appreciated by those skilled in the art that many different suitable spatial integration methods can be used for spatially integrating the gradient values, g. In some embodiments, the desired electrical property maps can be reconstructed from the derived gradient value, g, using a two-dimensional finite-difference method. Using a two-dimensional finite-different method, a small number of seeds points having known initial values for electrical properties are used. Defining $\ln \varepsilon_c$ in a two-dimensional M×N array, and given the estimated gradient values, g, a number (M·N) of central-difference, forward-difference, or backward-difference equations can be constructed for all the points in the two-dimensional array. An example of the central-difference formula for the internal points is given as, $$\frac{\xi(m, n+1) - \xi(m, n-1)}{2\Delta x} = g_x(m, n) \quad (7)$$

$$\frac{\xi(m+1, n) - \xi(m-1, n)}{2\Delta y} = g_y(m, n);$$

where $\xi = \ln \varepsilon_c$; $1 \le m \le M$; $1 \le n \le N$; and $\Delta x$ and $\Delta y$ denote the step sizes. The initial electrical property values for the seeds points, $\hat{\xi}(\hat{m}, \hat{n})$, can be assigned to the unknown values, $\xi$, at those seed points as follows, $$\xi(\hat{m}, \hat{n}) = \hat{\xi}(\hat{m}, \hat{n}) \quad (8).$$

The final electrical property maps can be extracted in the exponential of $\xi$, which returns the complex permittivity, $\varepsilon_c$, from which both conductivity, $\sigma$, and permittivity, $\varepsilon$, can be extracted. $B_1$ Referring now to FIG. 1, a flowchart setting forth the steps of an example of a method for measuring electrical properties of an object, and for producing maps of those electrical properties, using an MRI system is illustrated. The MRI system may include a multichannel transmitter and a multichannel receiver, which may collectively form a multichannel transceiver. Data are acquired with the MRI system using an RF coil array in communication with the multichannel transmitter and multichannel receiver of the MRI system. As one example, the RF coil array can include a 16-channel microstrip array RF coil, such as the one described by G. Adriany, et al., in "A geometrically adjustable 16-channel transmit/receive transmission line array for improved RF efficiency and parallel imaging performance at 7 Tesla," *Magn. Reson. Med.,* 2008; 59:590-597.

The method includes directing the MRI system to acquire data indicative of a $B_1^+$ field on each channel in a multichannel transmitter, as indicated at step 102. As one example, this data can be acquired as a series of low flip angle (e.g., a nominal flip angle of ten degrees), two-dimensional gradient-recalled echo images with one channel transmitting at a time and all channels receiving together. In some embodiments, a similar series of larger flip angle GRE images can be used to derive the relative $B_1^+$ phase with higher SNR.

In some embodiments, a three-dimensional flip angle map is provided, as indicated at step 104. For instance, the three-dimensional flip angle map can be provided by acquiring such a map using an actual flip angle imaging ("AFI") method with all channels transmitting together with a nominal flip angle of ninety degrees. The AFI method is described, for example, by V. L. Yarnykh in "Actual flip-angle imaging in the pulsed steady state: A method for rapid three-dimensional mapping of the transmitted radiofrequency field," *Magn. Reson. Med.,* 2007; 57:192-200.

The method also includes directing the MRI system to acquire indicative of a $B_1^-$ field on each channel in a multichannel receiver, as indicated at step 106. As one example, this data can be acquired as a series of two-dimensional gradient-recalled echo images obtained with all channels transmitting together with a long repetition time ("TR"), which may be a TR much greater than $T_1$ (e.g., on the order of ten seconds). This series of images is acquired using a relatively larger nominal flip angle (e.g., around ninety degrees) to reach higher SNR. Preferably, this series of images is acquired using the same $B_1$ excitation configuration as the three-dimensional flip angle map.

The magnitude and relative phase values of the measured $B_1^+$ fields are calculated from the acquired $B_1^+$ field measurements, as indicated at step 108. For instance, the raw data from the low flip angle GRE images can be converted to $|B_1^+|$ values after being normalized by the measured three-dimensional flip angle map. The relative phase, $\Delta\phi^+$, can be extracted from the large flip angle GRE images with one channel transmitting at a time.

The magnitude and relative phase values of the measured $B_1^-$ field are calculated from the acquired $B_1^-$ field measurements, as indicated at step 110. For instance, the raw data from the large flip angle GRE images can be converted to a proton density-weighted magnitude value, $|\rho B_1^-|$ after being normalized by the sine of the measured three-dimensional flip angle map. The relative phase, $\Delta\phi^-$, can also be extracted from the large flip angle GRE images.

Because the proton density, $\rho$, is not immediately accessible to measurement by the MRI system, an empirical estimation of $\rho$ can be used to remove the proton density weighting from the $B_1^-$ magnitude values. As an example, the approximately mirroring left-right symmetry between the summations of the magnitudes of $B_1^+$ and $B_1^-$ when using a symmetric transceiver RF coil array can be utilized to estimate $\rho$ based on measured $|B_1^+|$ and $|\rho B_1^-|$ maps. These estimated values can then be used to remove the proton density weighting from the computed $|\rho B_1^-|$ maps.

In some embodiments, the proton density weighting can be addressed not by empirical estimation, but by generalizing the electrical property estimation framework detailed above to expressly account for and estimate proton density. To this end, Eqn. (6) can be modified as follows:

$$\nabla^2(\gamma \hat{B}_1^-) = -\omega^2 \mu_0 \gamma \hat{B}_1^- \varepsilon_c + \nabla(\gamma \hat{B}_1^-)^T \begin{bmatrix} 1 & -i & 0 \\ i & 1 & 0 \\ 0 & 0 & 1 \end{bmatrix} g; \quad (9)$$

where $\hat{B}_1^-$ denotes the measureable proton-density-weighted receive $B_1$ field, $\hat{B}_1^- = \rho B_1^-$, and $\gamma = 1/\rho$. Using Eqn. (9) instead of Eqn. (6), it is possible to derive the unknown parameter, $\nabla \ln \gamma$, in addition to the gradient values, g. From the parameter, $\nabla \ln \gamma$, an estimate of the proton density can be directly calculated.

Using the estimated magnitude and relative phase values of the $B_1^+$ and $B_1^-$ fields in each channel, gradient values that are based on a gradient field of a logarithm of complex permittivity can be estimated, as indicated at step 112. As one example, the gradient values can be estimated by solving the set of equations defined by Eqns. (5) and (6) using estimated, or otherwise provided, proton density values, such as those estimated using the symmetry assumption described above. As another example, the gradient values can be simultaneously estimated along with proton density by solving the set of equations defined by Eqns. (5) and (9).

From the calculated gradient values, electrical property values can be determined, as indicated at step 114. As described above, electrical property maps can be reconstructed using a spatial integration method. Using this approach, at least one seed point with known electrical property values is needed to convert the estimated gradient values into absolute electrical property maps. As an example, electrical property information for a known anatomical region can be assigned to a seed point located within that anatomy.

It is contemplated that using three seed points will provide acceptable results in most practical applications; however, it will be appreciated by those skilled in the art that, as one would expect, the more seed points that are utilized, the more reliable and stable the resultant electrical property images will become. In some embodiments, the electrical property values of a few seed points can be obtained from regions expected to exhibit relatively smooth local electrical property distributions (e.g., large white matter bundles when imaging the brain). In these locations, homogeneous-Helmholtz-based EPT methods can be utilized to measure absolute electrical property values at the seed point locations.

After determining the electrical property values, a report can be generated based on the determined electrical property values, as indicated at step 116. For instance, the report may include one or more reconstructed electrical property maps, which are images that depict the distribution of the electrical properties in the imaged subject.

In some embodiments, the absolute phase distribution of the $B_1^+$ and $B_1^-$ fields can be derived by solving Eqns. (5) and (6), and thus may optionally be determined, as indicated at step 118. Together with the measured magnitude distributions of these fields, complex $B_1$ information is thus available and can be estimated using the systems and methods of the present invention. Thus, in some embodiments the report generated in step 116 may include information based on the estimated absolute phase distributions of the $B_1^+$ and $B_1^-$ fields. For instance, the generated report may include images, or maps, that depict the absolute phase distributions of the $B_1^+$ and $B_1^-$ fields.

In addition to providing images of the electrical property distributions in a subject, the electrical property and complex $B_1$ maps produced using the systems and methods of the present invention can optionally be utilized for monitoring specific absorption rate ("SAR") for a particular subject, as indicated at step 120.

It has been shown that electrical properties of biological tissues can be derived from magnetic resonance imaging based measurements of $B_1$ fields. A strong appeal for EPT methods is to estimate real-time and subject-specific local specific absorption rate ("SAR") induced by RF pulsing.

Local SAR is defined as, $$SAR = \frac{\sigma(|\tilde{E}_x|^2 + |\tilde{E}_y|^2 + |\tilde{E}_z|^2)}{2\rho}; \quad (10)$$

where $\tilde{E}_x$, $\tilde{E}_y$, and $\tilde{E}_z$ are Cartesian components of the induced electric field, and $\rho$ is material mass density. Under the assumption that $|\tilde{E}_z|$ dominates the electric field, it is possible to only consider the $|\tilde{E}_z|$ component in local SAR estimation, and $|\tilde{E}_z|$ can be derived from the electrical property and complex $B_1$ maps produced using the systems and methods described above, $$SAR \approx \frac{\sigma|\tilde{E}_z|^2}{2\rho}. \quad (11)$$

Voxel-wise local SAR can be estimated using complex $B_1$ measurements and the electrical properties (e.g., conductivity) reconstructed using the methods described above. The local SAR measurements can then be averaged into 10-gram SAR. Similarly, various SAR estimations may be obtained from the complex $B_1$ measurements and the electrical properties, by setting up certain ranges for the purpose of safety evaluation, in consideration of other known information about biological electrical properties.

For a short period time (e.g., up to several minutes) after the initiation of RF-heating, effects of thermal conduction can be neglected and the temperature increase, $\Delta T$, over time, $\tau$, can be treated as being proportional to the induced SAR as, $$\Delta T = \frac{\tau \cdot SAR}{C}; \quad (12)$$

where C is heat capacity. Therefore, it is possible to relate local SAR distribution to temperature changes, thereby providing a method for predicting MRI thermometry from electrical property measurements measured with the MRI system.

The systems and methods of the present invention provide at least two advantages overcoming the challenges in current EPT technologies. First, the gradient term, $g = \nabla \ln \varepsilon_c$, provides necessary information for accurate reconstruction along the boundaries of tissues with different electrical properties. In previous methods that utilize the homogeneous Helmholtz equation, there are typically significant deviations in the estimated electrical property values, especially near tissue boundaries. Some attempts have been made to address this boundary issue, such as in the adaptive-filter approach described by M. Huhndorf, et al., in "Systematic Brain Tumor Conductivity Study with Optimized EPT Sequence and Reconstruction Algorithm," *In Proceedings of the 21th Annual Meeting of ISMRM*: Salt Lake City, USA; 2013. p. 3626. However, this adaptive-filter approach heavily relies on the accuracy of a pre-segmentation of imaged objects, which can make it challenging to sustain the fidelity of the estimation in small inhomogeneous regions where accurate segmentation is difficult.

Secondly, because integration over the gradient term, g, is used to obtain the electrical property maps, the results become more robust to noise and calculation errors in comparison with the conventional electrical property estimation techniques. This reduction in noise can be attributed to the inherent low-pass filtering property of the integration on the gradient values, g. Previous EPT methods obtain electrical property maps directly through differentiation on the $B_1$ fields without explicitly utilizing the gradient-based information.

Magnetic resonance signals are by nature contaminated with noise. Some insight into the high sensitivity of conventional non-gradient-based EPT to measurement noise can be gained by looking at Eqns. (2) and (3). In doing so, it can be seen that the Laplacian operator will amplify errors that then propagate linearly into the complex permittivity, $\varepsilon_c$, and its derivative, g. With gEPT, the integration on the gradient values, g, largely attenuates such amplified noise-related errors, as well as other model-based error sources, such as the elimination of $B_z$, while preserving the useful boundary information. The increased performance of gEPT against measurement noise will in return contribute to improved boundary reconstruction by eliminating the use of strong spatial filter on $B_1$ field and advancing spatial resolution of $B_1$-mapping. As a result, significant improvement in EP map quality can be obtained in vivo.

Figure 2:
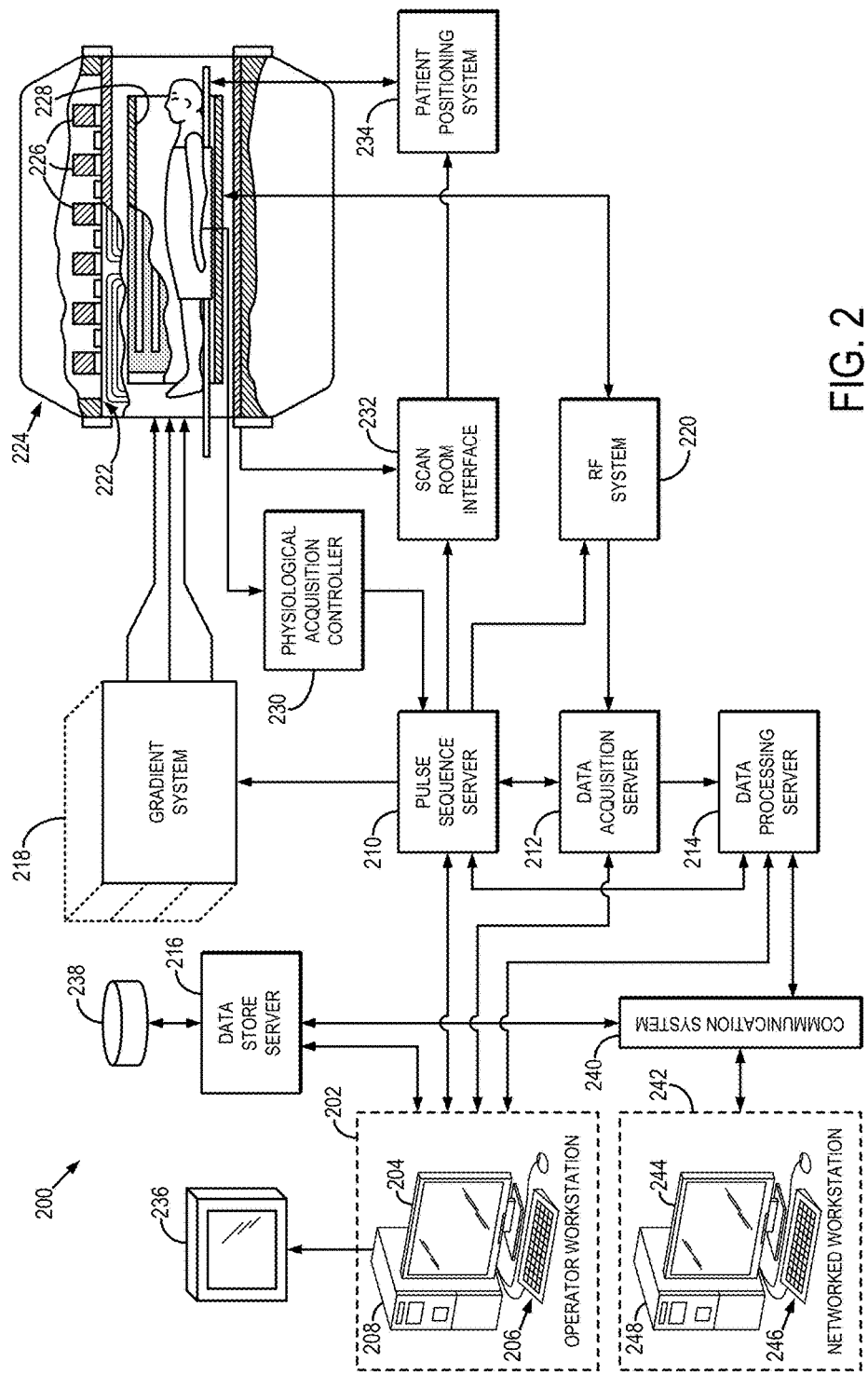
FIG. 2 is a block diagram of an example of an MRI system.

Referring particularly now to FIG. 2, an example of a magnetic resonance imaging ("MRI") system 200 is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (13);$$

and the phase of the received magnetic resonance signal may also be determined according to the following relationship:

$$\varphi = \tan^{-1}\left(\frac{Q}{I}\right). \quad (14)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

Figure 3:
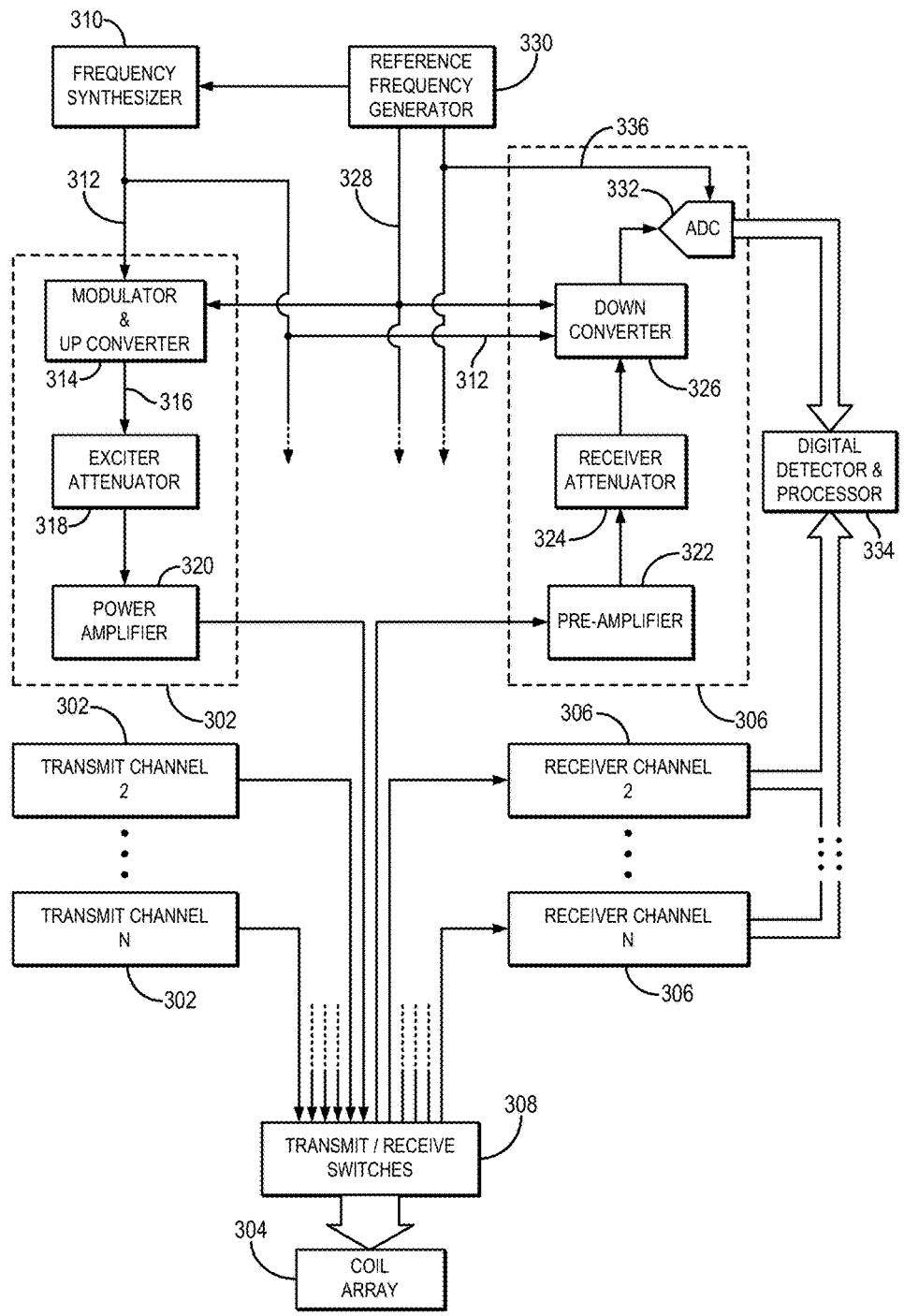
FIG. 3 is a block diagram of an example of a multichannel transmitter and a multichannel receiver that may form a part of the MRI system of FIG. 2.

As shown in FIG. 2, the radiofrequency ("RF") system 220 may be connected to the whole body RF coil 228, or, as shown in FIG. 3, a transmission section of the RF system 220 may connect to one or more transmit channels 302 of an RF coil array 304 and a receiver section of the RF system 220 may connect to one or more receiver channels 306 of the RF coil array 304. The transmit channels 302 and the receiver channels 306 are connected to the RF coil array 304 by way of one or more transmit/receive ("T/R") switches 308.

Referring particularly to FIG. 3, the RF system 220 includes one or more transmit channels 302 that produce a prescribed RF excitation field. The base, or carrier, frequency of this RF excitation field is produced under control of a frequency synthesizer 310 that receives a set of digital signals from the pulse sequence server 210. These digital signals indicate the frequency and phase of the RF carrier signal produced at an output 312. The RF carrier is applied to a modulator and up converter 314 where its amplitude is modulated in response to a signal, R(t), also received from the pulse sequence server 210. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 316 is attenuated by an exciter attenuator circuit 318 that receives a digital command from the pulse sequence server 210. The attenuated RF excitation pulses are then applied to a power amplifier 320 that drives the RF coil array 304.

The MR signal produced by the subject is picked up by the RF coil array 304 and applied to the inputs of the set of receiver channels 306. A preamplifier 322 in each receiver channel 306 amplifies the signal, which is then attenuated by a receiver attenuator 324 by an amount determined by a digital attenuation signal received from the pulse sequence server 210. The received signal is at or around the Larmor frequency, and this high frequency signal is down converted in a two step process by a down converter 326. The down converter 326 first mixes the magnetic resonance signal with the carrier signal on line 312 and then mixes the resulting difference signal with a reference signal on line 328 that is produced by a reference frequency generator 330. The down converted magnetic resonance signal is applied to the input of an analog-to-digital ("A/D") converter 332 that samples and digitizes the analog signal. The sampled and digitized signal is then applied to a digital detector and signal processor 334 that produces 16-bit in-phase (I) values and 16-bit quadrature (Q) values corresponding to the received signal. The resulting stream of digitized I and Q values of the received signal are output to the data acquisition server 212. In addition to generating the reference signal on line 328, the reference frequency generator 330 also generates a sampling signal on line 336 that is applied to the A/D converter 332.

Figure 4:
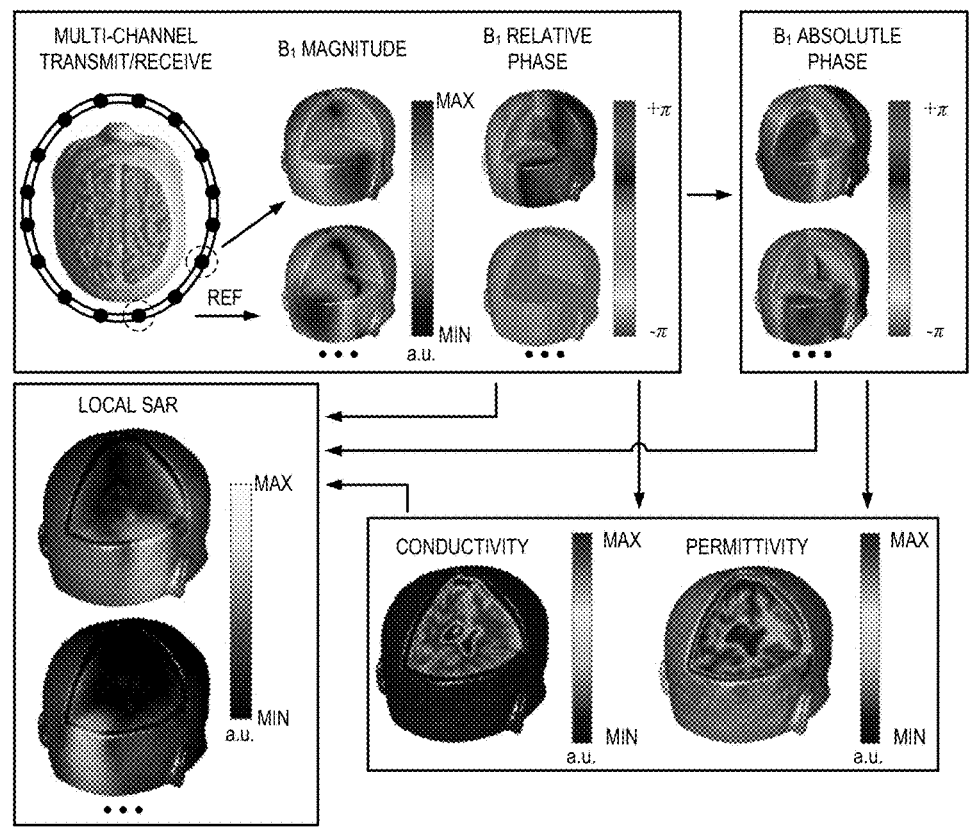
FIG. 4 is a diagram of an example workflow for using a multichannel transmitter and a multichannel receiver to measure $B_1$ magnitude and $B_1$ relative phase for estimating the absolute phase of $B_1$ and for imaging electrical properties and local SAR.

An example implementation of the systems and methods described here is illustrated in FIG. 4. With a reference channel, transmit and receive $B_1$ magnitude and their relative phase can be acquired, and then used to reconstruct electrical conductivity and permittivity of a subject. From the estimated $B_1$ magnitude and relative phase, the absolute phase of $B_1$ field can be further estimated and then used, together with $B_1$ magnitude, to estimate local specific absorption rate in a subject.

Figure 5:
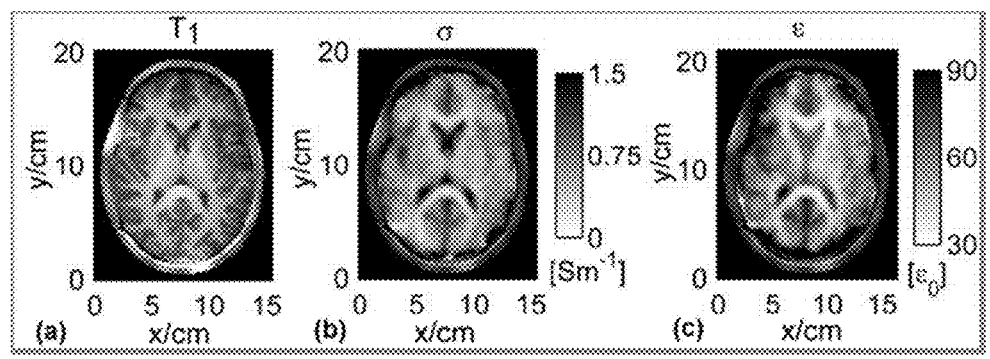
FIG. 5 is an example of EPT imaging in a human subject, together with $T_1$-weighted structural images obtained with MRI.

An example of electrical properties estimation is illustrated in FIG. 5, in which a human subject's electrical conductivity (middle) and electrical permittivity (right) maps were estimated and displayed together with $T_1$-weighted structural images of the same subject.

In some other embodiments, an image of the electrical properties of a subject with cancer can be produced using magnetic resonance imaging ("MRI"), where the cancer may be located in any portion of the body of the subject. The electrical properties are determined based on estimated gradient values of the electrical properties of the subject, as described above. The regions of significantly deviated electrical properties (from normal tissue) may be determined as candidate sites of cancerous tissue because previously studies have indicated that significant deviations of electrical properties exist in cancerous tissues relative to benign tissues. An example of such as study is the one described by R. J. Halter, et al., in "Electrical impedance spectroscopy of benign and malignant prostatic tissues," *The Journal of Urology*. 2008; 179(4):1580-1586. Knowing the background electrical properties of tissue can improve the specificity of RF-induced hyperthermia treatment of cancers towards cancerous tissue as suggested by S. A. Solazzo, et al., in "Radiofrequency Ablation: Importance of Background Tissue Electrical Conductivity—An Agar Phantom and Computer Modeling Study," *Radiology*. 2005; 236(2):495-502.

Furthermore, based upon measurements of transmit and receive $B_1$ fields, local SAR maps can be estimated, as described above. Such local SAR maps, or other types of SAR maps (e.g. 10-gram SAR maps, or conservatively overestimated SAR maps), can be used to guide energy deposition prediction in the tissues. In addition, a thermometry can be estimated from the electrical properties based SAR maps. Such local SAR maps, or their variance, or SAR-derived thermometry may be used to guide pulse sequence design in high-field or ultra-high-field MRI systems to optimize pulse sequence to maximize the performance while at the same time keeping subject at safe.

In summary, systems and methods for a gradient-based magnetic resonance electrical properties tomography ("gEPT") approach have been described. The gEPT systems and methods provide greatly enhanced boundary reconstruction and robustness to measurement noise as compared to previous EPT methods. By generating more accurate and more stable in vivo electrical property maps, the gEPT method promises to help develop a more significant role of EPT in the investigation of fundamental aspects of tissues, clinical diagnosis, and SAR prediction.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for measuring electrical properties of a tissue using a magnetic resonance imaging (MRI) system, the steps of the method comprising:
   a) directing the MRI system to acquire $B_1^+$ map data for each channel in a multichannel transmitter while a subject is present in the MRI system;
   b) directing the MRI system to acquire a $B_1^-$ map data for each channel in a multichannel receiver while the subject is present in the MRI system;
   c) generating from the acquired $B_1^+$ map data, $B_1^+$ field magnitude map and a $B_1^+$ relative phase map for each channel in the multichannel transmitter;
   d) generating from the acquired $B_1^-$ map data, a $B_1^-$ field magnitude map and a $B_1^-$ relative phase map for each channel in the multichannel receiver;
   e) estimating a spatial gradient value that is based on a spatial gradient of electrical properties of the tissue, the spatial gradient value being estimated from the derived $B_1^+$ field magnitude maps, $B_1^+$ relative phase maps, $B_1^-$ field magnitude maps, and $B_1^-$ relative phase maps;
   f) estimating electrical property values in the subject by spatially integrating the estimated spatial gradient values; and
   g) generating a report comprising an image that depicts a spatial distribution of the computed electrical property values in the subject.

2. The method as recited in claim 1, wherein the multichannel transmitter and the multichannel receiver comprise a multichannel transceiver.

3. The method as recited in claim 1, wherein step f) includes spatially integrating the estimated gradient values to calculate logarithm values of complex permittivity values in the subject, and computing the electrical property values includes calculating the complex permittivity values from the logarithm values.

4. The method as recited in claim 3, wherein step f) includes determining at least one of conductivity values and permittivity values in the subject based on the calculated complex permittivity values.

5. The method as recited in claim 1, wherein the estimated gradient values are spatially integrated in step f) using at least one of a finite difference method, a finite element method, and a layer potential method.

6. The method as recited in claim 5, wherein step f) includes assigning known electrical property values to at least one seed point before spatially integrating the estimated gradient values.

7. The method as recited in claim 1, wherein step f) includes estimating the electrical property values for at least one seed point before spatially integrating the estimated spatial gradient values.

8. The method as recited in claim 1, wherein step e) includes solving a set of equations that relates the derived $B_1^+$ field magnitude maps, $B_1^+$ relative phase maps, $B_1^-$ field magnitude maps, and $B_1^-$ relative phase maps to the gradient value that is based on a complex permittivity, which is an unknown in the set of equations.

9. The method as recited in claim 1, wherein the $B_1^+$ map data acquired for a given channel in the multichannel transmitter in step a) includes a series of images acquired while transmitting only on the given channel in the multichannel transmitter and receiving on all channels in the multichannel receiver.

10. The method as recited in claim 9, wherein the series of images is acquired using a nominal flip angle of around ten degrees.

11. The method as recited in claim 1, wherein the $B_1^-$ map data acquired for a given channel in the multichannel receiver in step b) includes a series of images acquired while transmitting on all channels in the multichannel transmitter and receiving only on the given channel in the multichannel receiver.

12. The method as recited in claim 11, wherein the series of images is using a nominal flip angle of around ninety degrees.

13. The method as recited in claim 1, wherein the $B_1^-$ field magnitude maps generated in step d) are proton density-weighted $B_1^-$ field magnitude maps, and step d) includes removing the proton density weighting based on estimated proton density values in the subject.

14. The method as recited in claim 1, further comprising providing a flip angle map, and wherein step c) includes using the provided flip angle map to generated the $B_1^+$ field magnitude map from the acquired $B_1^+$ map data, and step d) includes using the provided flip angle map to generated the $B_1^-$ field magnitude map from the acquired $B_1^-$ map data.

15. The method as recited in claim 1, further comprising calculating a local specific absorption rate (SAR) distribution in the subject based on the electrical property values computed in step f).

16. The method as recited in claim 15, further comprising estimating a temperature distribution in the subject due to the local SAR distribution, and using at least one of the calculated local SAR distribution and the estimated temperature distribution to guide an optimization of an MRI pulse sequence design.

17. The method as recited in claim 1, wherein the report generated in step g) also provides information associating the estimated electrical properties with a pathological state of tissues in the subject.

18. The method as recited in claim 1, wherein the report generated in step g) also provides an indication of whether tissues in the subject are cancerous based on the estimated electrical properties.

19. The method as recited in claim 1, further comprising estimating at least one of:
a $B_1^+$ absolute phase distribution from the generated $B_1^+$ magnitude maps and $B_1^+$ relative phase maps; and
a $B_1^-$ absolute phase distribution from the generated $B_1^-$ magnitude maps and $B_1^-$ relative phase maps.

20. The method as recited in claim 1, further comprising producing a radio frequency (RF) hyperthermia treatment plan based on the report generated in step g).

21. The method as recited in claim 1, further comprising generating a report that indicates a pathological state of a tissue or anatomical structure; wherein the report is generated based on the estimated spatial gradient values.

* * * * *

UNITED STATES PATENT AND TRADEMARK OFFICE
CERTIFICATE OF CORRECTION

PATENT NO. : 10,191,126 B2  
APPLICATION NO. : 14/245145  
DATED : January 29, 2019  
INVENTOR(S) : Bin He et al.

Page 1 of 1

It is certified that error appears in the above-identified patent and that said Letters Patent is hereby corrected as shown below:

In the Claims

Column 14, Claim 1, Line 47, "data, $B_1^+$" should be -- data, a $B_1^+$ --.

Signed and Sealed this  
Twenty-sixth Day of March, 2019

Andrei Iancu  
*Director of the United States Patent and Trademark Office*